United States Patent [19]
Nossen

[11] Patent Number: 4,704,574
[45] Date of Patent: Nov. 3, 1987

[54] PHASE DIFFERENCE MEASUREMENT APPARATUS AND METHOD

[75] Inventor: Edward J. Nossen, Cherry Hill Township, N.J.

[73] Assignee: RCA Corporation, Princeton, N.J.

[21] Appl. No.: 900,525

[22] Filed: Aug. 26, 1986

[51] Int. Cl.[4] .................................. G01R 25/00
[52] U.S. Cl. .............................. 324/83 D; 328/133
[58] Field of Search ............... 324/83 R, 83 A, 83 D, 324/77 R; 328/133, 134, 155; 342/60

[56] References Cited

U.S. PATENT DOCUMENTS

| | | | |
|---|---|---|---|
| B 458,010 | 3/1976 | Sem-Sandberg | 324/83 D |
| 3,663,956 | 5/1972 | Purdy et al. | 324/83 D |
| 3,924,183 | 12/1975 | Fletcher et al. | 324/79 D |
| 3,984,771 | 10/1976 | Nossen et al. | 324/83 D |
| 4,004,237 | 1/1977 | Kratzer | 328/133 |
| 4,025,848 | 5/1977 | Delagrange et al. | 324/83 D |
| 4,247,898 | 1/1981 | Bosselaers | 364/460 |
| 4,361,890 | 11/1982 | Green, Jr. et al. | 375/1 |
| 4,419,624 | 12/1983 | Brown | 324/83 D |
| 4,513,285 | 4/1985 | Pike et al. | 343/5 PN |
| 4,527,126 | 7/1985 | Petrich et al. | 328/155 |
| 4,532,516 | 7/1985 | Frampton et al. | 343/17.7 |
| 4,583,856 | 4/1986 | Moore | 356/358 |
| 4,652,838 | 3/1987 | Nossen | 342/60 |

OTHER PUBLICATIONS

Chapter 18-8 entitled "Verneir Counting", at pp. 683-687 of the text Pulse, Digital and Switching Waveforms, by Millman and Taub, published 1965 by McGraw-Hill.

Primary Examiner—Michael J. Tokar
Attorney, Agent, or Firm—Clement A. Berard, Jr.; William H. Meise

[57] ABSTRACT

An arrangement for coarse and vernier measuring of the delay or phase shift introduced by a delay path by generating a recurrent pseudorandom signal at an original chip clock rate derived from a reference clock. At the receiving end of the delay path, a delay locked loop regenerates the chip clock and the pseudorandom signal at a phase established by the delay. The coarse count is measured by the number of chip clock cycles. The vernier delay is measured in terms of a fractional portion of a chip clock cycle. The vernier measurement is made by starting a counter which counts reference clock signals in response to a coincidence of the original chip clock and the reference clock, and by ending counting and latching the count in response to coincidence of the regenerated chip clock and the reference clock.

6 Claims, 9 Drawing Figures

PHASE DIFFERENCE MEASUREMENT APPARATUS AND METHOD

This invention relates to arrangements for measuring signal phase or delay, and more particularly to arrangements for measuring round trip phase or delay in a closed loop.

BACKGROUND OF THE INVENTION

It may be desirable for many reasons to know the time required for a signal to traverse a closed path. For example, radar and sonar systems perform range determination by transmitting pulses of energy towards the target whose distance is to be determined, and determining the time required for the pulse of energy to return. In a satellite communication system, it is important to know the delay in a round trip path between an Earth station and the satellite for synchronization purposes.

When a repetitive signal such as a sine wave is transmitted through a delay, the delay may be couched in terms of relative phase rather than in terms of time. The phase shift $\Delta\phi$ is given by the expression $$\Delta\phi = [\text{delay/period}][360°] \quad (1),$$

where the delay is the delay between the reference sample and the delayed sample of the periodic waveform in seconds, and the period is the time duration of one recurrence of the waveform. Expressed in terms of frequency, the relative phase shift is given by $$\Delta\phi = [\text{delay} \times \text{frequency}][360°] \quad (2)$$

Thus, the measurement of delay and the measurement of phase of a recurrent waveform are closely related. By determining phase the delay can be established, and vice versa.

A well known technique for measuring delay is to transmit an identifiable signal into the signal delay path, and to simultaneously start a counter which counts a reference clock. When the identifiable signal is returned, it turns off the counter. The count stored in the counter multiplied by the duration of each cycle of the reference clock is a measure of the delay. This technique is described at pp. 683–687 in the text "Pulse, Digital And Switching Waveforms", by Millman and Taub, published 1965 by McGraw-Hill. As described therein, the technique is subject to count uncertainties of ±1 or ±2 counts. The magnitude of the error introduced by these uncertainties may be reduced by increasing the frequency of the reference clock pulses which are counted by the counter. Inexpensive counters have a relatively limited maximum frequency of operation, however, and for many applications it is not economically feasible to use specialized high speed counters. Millman and Taub describe a vernier counting technique which is used together with the basic technique for providing further resolution in determining the delay. According to the vernier counting technique, a further reference clock signal is generated, the period of which is shorter than the period of the reference clock by a predetermined amount. When the identifiable signal returns from the delay path and turns off the counter which counts the reference clock pulses (thereby storing the gross count), it also turns on a further counter which counts the further clock pulses. The further counter is turned off in response to the coincidence of the reference clock pulses and further clock pulses. The count remaining in the further counter is a representation of the time at which the identifiable signal returns between two successive reference clock pulses. This technique may be disadvantageous because the further reference pulse period is not well controlled and therefore gives uncertain results, because the frequency of the further clock pulse is higher than the frequency of the reference clock, which is already near the maximum operating frequency of the counters, and because counting takes place not only during the time the identifiable signal traverses the delay path but also thereafter for an indeterminate period of time (which may be significant when measurements are made in succession at different target ranges).

An apparatus and method is desirable for accurately measuring delay or phase by use of a highly accurate vernier technique in which the clock signal which provides the vernier count is at a lower frequency than the clock signal which provides the gross count, and in which counting is ended at the time the identifiable signal returns.

SUMMARY OF THE INVENTION

A method and apparatus for measuring the round trip delay of a signal path which includes the steps of generating a reference clock signal having a reference frequency, and slaving a chip clock signal to the reference clock signal at a chip clock frequency which is a multiple of the reference frequency. The multiple is the ratio of integers. The chip clock signal is modulo counted to produce reset signals at a predetermined count and to generate a count signal. A pseudorandom signal having a particular pattern has its chips generated at the chip clock signal frequency. The pseudorandom signal is initiated or recurs in response to the reset signals. The resulting recurrent pseudorandom signal is transmitted into a first end of the signal path and is received at the second end of the signal path with a delay imparted by the signal path. A delay locked loop is coupled to the output end of the delay path. The delay locked loop includes a controllable oscillator having a rest frequency near the chip clock frequency, and also includes a second modulo counter and a second pseudorandom generator identical to those by which the pseudorandom signal was generated, for generating a replica pseudorandom signal locked to the delayed pseudorandom signal received from the signal delay path. The delay locked loop forces the control oscillator frequency exactly to the reference chip clock frequency, and also forces the replica pseudorandom signal into phase coincidence with the delayed pseudorandom signals. The reset signals of the second modulo counter of the delay locked loop latch the count of the first modulo counter to form a coarse count with the resolution established by the chip clock. Vernier counting is accomplished by generating a START signal at each coincidence of the chip clock signal with the reference clock signal, and beginning counting of the reference clock signal in response to the START signal. A STOP signal is generated at each coincidence of the replica chip clock signal with the reference clock signal. Counting of the reference clock signal is ended in response to the STOP signal. The count of the reference clock signal at the moment of occurrence of the STOP signal represents the vernier delay.

DETAILED DESCRIPTION OF THE INVENTION

Figure 1:
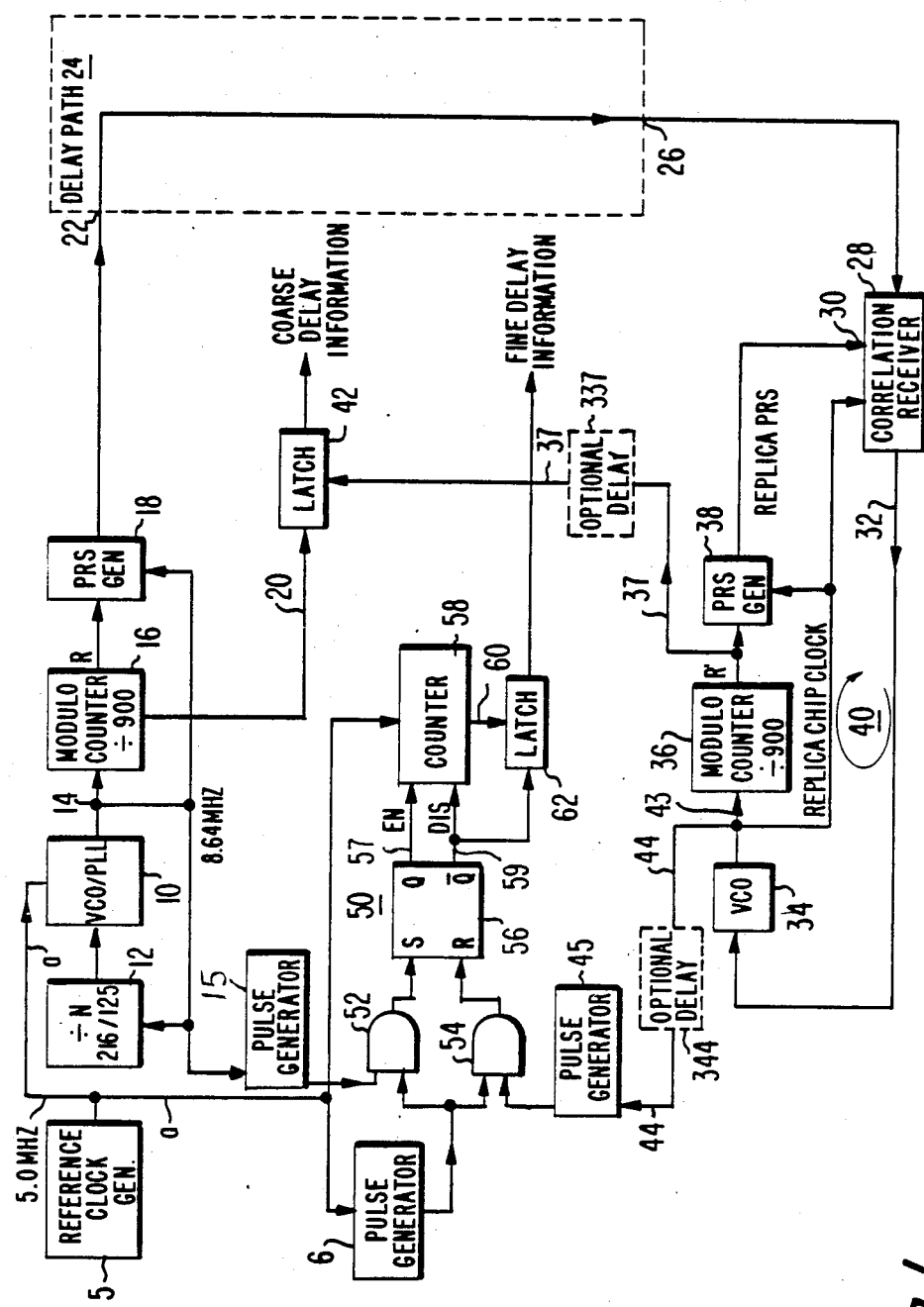
FIG. 1 is a block diagram of an embodiment of the invention, illustrating by dotted lines certain elements required for other embodiments of the invention.

FIG. 1 is a block diagram of an embodiment of the invention. In FIG. 1, a reference clock generator 5 produces standard 5.0 MHz clock pulses on a conductor designated a. The 5.0 MHz reference clock pulses are applied by way of a pulse generator 6 to the input terminals of AND gates 52 and 54, and are also applied to an input terminal of a voltage controlled oscillator (VCO) and phase lock loop (PLL) illustrated together as a VCO/PLL 10, the output of which is applied by a conductor 14 to a pulse generator 15 and to the input terminal of a divide-by-N ($\div$N) divider 12. Divider 12 divides the frequency by the ratio of integers, such as the ratio 216/125, to produce a divided-frequency signal which is applied to a second input terminal of VCO/PLL 10 for comparison with the 5.0 MHz reference clock pulses. The VCO/PLL 10 produces at its output conductor 14 chip clock pulses at a frequency which is N times the 5.0 MHz input frequency, which in the case of multiplication by 216/125, is 8.64 MHz. The chip clock pulses at 8.64 MHz are applied over conductor 14 to an input terminal of a modulo counter 16 and to a chip clock input terminal of a pseudorandom signal (PRS) generator 18. Modulo counter 16 counts the chip clock signals received over conductor 14 up to a maximum value such as 900 and produces a signal on multiconductor set 20. Digital signals may be carried in serial form over single conductors or in parallel form over multiconductor sets. Those skilled in the art understand that the conductors must match the data to be carried, and multiconductor sets are hereinafter referred to simply as conductors. The signal on conductor 20 represents the count, which increases from 0 to 900, whereupon at each count of 900 modulo counter 16 produces a reset (R) signal and resets itself to zero count. The R signal is a pulse which is applied to a reset input terminal of PRS generator 18 for resetting PRS generator 18 to its initial state. As a result, PRS generator 18 produces, at the 8.64 MHz chip rate, a 900-chip PRS signal which repeats beginning at each reset pulse. The 900-chip PRS signal has a duration of $900/8.64$ $(10^{-6})$ seconds or about 104 $\mu$S. The count signal produced by modulo counter 16 is applied by way of conductor 20 to a latch 42 for being latched, as described below. The recurrent PRS signal produced by generator 18 is applied in a continuous stream to the input end 22 of a signal delay path designated generally as 24.

The stream of recurrent pseudorandom signals exits at terminal 26 from delay path 24 and is applied to a correlation receiver 28, which is described in more detail below. Correlation receiver 28 compares the received stream of pseudorandom signals from terminal 26 with a replica of the pseudorandom signal applied at input terminal 30 and produces on a conductor 32 a control signal related to the phase difference therebetween. The control signal is applied over conductor 32 to a VCO 34 for controlling the frequency of a replica chip clock signal. The rest frequency of the replica chip clock signal produced by VCO 34 is nominally the same as the original chip clock signal produced by VCO/PLL 10 on conductor 14, which in the particular example is 8.64 MHz. The replica chip clock signal is applied from VCO 34 by way of a conductor 43 to a modulo counter 36 which is identical to modulo counter 16, at least in that modulo counter 36 counts modulo 900 and produces a reset signal (designated R') upon achieving the count of 900. The replica chip clock signal produced by VCO 34 is also applied over conductor 44 (and an optional delay 344, if desired, as further described below) to a pulse generator 45. The replica chip clock signal produced by VCO 34 is applied to correlation receiver 28, and to the chip clock input terminal of a PRS generator 38, which is programmed to produce the same pseudorandom pattern as that produced by PRS generator 18. PRS generator 38 is reset to its initial state by the R' signal from modulo counter 36 after it has produced 900 chips of pseudorandom signal. Thus, PRS generator 38 produces a 900-chip-long PRS signal identical to that produced by PRS generator 18, at a chip rate which is close to that produced by VCO/PLL 10. The PRS replica signal produced by PRS generator 38 is applied to input terminal 30 of correlation receiver 28, thereby closing a delay locked loop (DLL) designated generally as 40 which causes the frequency produced by VCO 34 to slew until the replica PRS signal produced by PRS generator 38 and the delayed PRS signal received from delay path 24 are in-phase, and when they are in-phase causes them to be held in-phase. When DLL 40 is locked, the frequency of the replica chip clock signal produced by VCO 34 is identical to the frequency of the original chip clock signal produced by VCO/PLL 10. When DLL 40 is locked, the replica PRS signal at input terminal 30 of receiver 28 is in-phase with the delayed PRS signal received from delay path 24, and therefore reset signal R' produced by modulo counter 36 occurs recurrently at each time of initiation of both the replica PRS signal produced by generator 38 and the delayed PRS signal delayed by delay path 24. Reset signal R' therefore is delayed relative to reset signal R produced by modulo counter 16 by an interval equal to the delay of delay path 24. Reset signal R' is applied over a conductor 37 (and an optional delay 337, as further described below) to the control input terminal of latch 42, which also continuously receives over conductor 20 signals representing the current count of modulo counter 16. At the moment that reset signal R' occurs, latch 42 latches the then current count of modulo counter 16. Since modulo counter 16 began counting in coincidence with its own reset signal R, modulo counter 16 has counted chip clock pulses from VCO/PLL 10 at the 8.64 MHz rate for a duration exactly equal to the delay of delay path 24 at the moment at which latch 42 latches the count. The count stored in latch 42 after the R' signal, therefore, represents the delay of delay path 24 within the resolution provided by the 8.64 MHz chip clock frequency produced by VCO/PLL 10.

As mentioned, the delay of delay path 24 may not be exactly equal to the count latched by latch 32 multiplied by the period of the chip clock. That is, the count stored in latch 32 provides an indication of how many complete chip clock periods are included in the delay, but gives no information about fractions of a clock period. The actual delay, therefore, might include almost a full additional chip clock period, only a very small proportion of an additional chip clock period, or a value inbetween. Additional information is provided by a vernier circuit designated generally as 50 which includes AND or coincidence gates 52 and 54. As mentioned, both AND gates 52 and 54 receive 5.0 MHz reference clock pulses at one of their inputs from pulse generator 6, and AND gate 52 also receives 8.64 MHz original chip clock pulses from VCO/PLL 10 by way of pulse generator 15. AND gate 54 further receives replica chip clock pulses from pulse generator 45 at the replica chip clock frequency. As also mentioned, when delay locked loop 40 is locked, the frequencies of the replica chip clock signals produced by VCO 34 and the resulting replica clock pulses produced by pulse generator 45 exactly equal the frequency of the original chip clock pulses produced by pulse generator 15. However, the replica chip clock pulses are in general not at the same phase as the original chip clock pulses. A pulse is produced at the output of AND gate 52 when the reference clock pulses coincide with the original chip clock pulses, and is applied to the set (S) input terminal of an RS flip-flop (FF) 56. A pulse is produced at the output of AND gate 54 when the reference clock pulses coincide with the replica clock pulses, and is applied to the reset (R) input terminal of FF 56. The Q output of FF56 produces a positive-going transition at the moment when FF56 is set, for enabling a counter 58. Counter 58 receives 5.0 MHz reference signals from generator 5. Counter 58 counts the reference clock signals and applies the current count over a conductor 60 to a latch 62. When FF56 is reset, its $\overline{Q}$ output terminal makes a transition which is applied over conductor 59 to counter 58 for terminating the count, and which is also applied to latch 62 for latching the count. As described below, the count held in latch 62 is a signal representing the fine delay information or the fractional portion of the delay of delay path 24 exceeding the duration of an integer number of original chip clock pulses.

Figure 2:
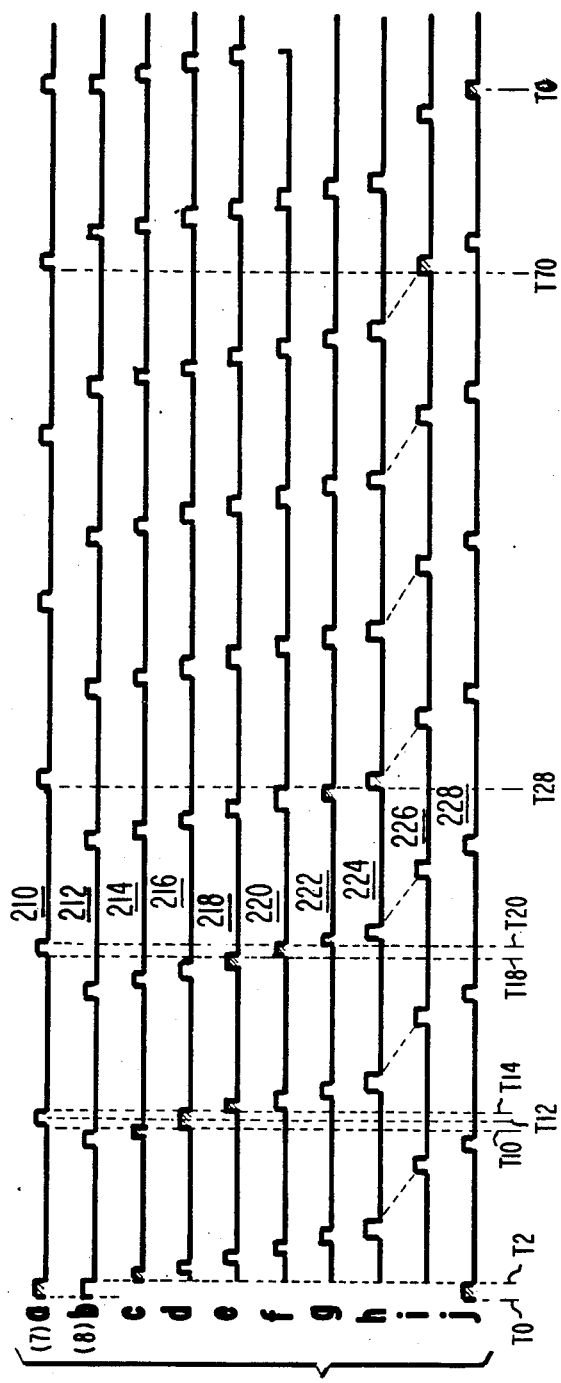
FIGS. 2a–2j are timing diagrams, referred to jointly as FIG. 2, illustrating reference pulses and the progressive coincidence of replica chip pulses with reference pulses for various incremental or vernier delays.

FIG. 2a illustrates the reference clock signal produced by reference clock generator 5 as a sequence or train of pulses 210. (If clock generator 5, VCO/PLL 10 and VCO 34 produce pulses rather the square waves, pulse generators 6, 15 and 45 are not required and may be dispensed with.) The chip clock pulses produced by VCO/PLL 10 are illustrated in FIG. 2b as a pulse train waveform 212. As illustrated in FIGS. 2a and 2b, the ratio of the frequency of pulses 212 to the frequency of pulses 210 is the ratio 8/7. The ratio 8/7 is selected because ratios such as 216/125 are difficult to illustrate clearly. As illustrated in FIGS. 2a and 2b, pulses of pulse trains 210 and 212 occur simultaneously or coincide in time at recurrent times T0, and do not coincide at other times. AND gate 52 (FIG. 1) produces an output signal in response to the coincidence at each recurrent time T0, corresponding to the time at which PRS generator 18 is returned to its initial state and begins a new 900-chip pseudorandom signal. Consequently, the time illustrated in FIG. 2 between recurrent times T0 corresponds to the duration of one PRS cycle (about 104 μS in the case of the 8.64 MHz, 900-chip example). The coincidence signal produced at the output of AND gate 52 sets FF56, thereby causing a transition at its Q output which is applied over conductor 57 to enable counter 58. Counter 58 therefore begins to count reference clock signals in coincidence with the initiation of each new PRS cycle by PRS generator 18.

When delay locked loop 40 is locked, the replica chip clock signal produced by VCO 34 will be in some arbitrary phase relative to the original chip clock signal produced by VCO/PLL 10. The exact phase will depend upon the delay of the delay path 24. FIGS. 2c–2j illustrate various different out-of-phase conditions which may occur. Since the replica chip clock signal may happen to be in-phase with the original chip clock signal produced by VCO/PLL 10, waveform 212 of FIG. 2b in addition to representing the original chip clock signal produced by VCO/PLL 10 also represents a possible in-phase condition of the replica chip clock signal. Waveform 214 of FIG. 2c illustrates a condition in which the replica chip clock signal is slightly out-of-phase with the original chip clock signal illustrated by waveform 212 of FIG. 2b. As illustrated in FIG. 2c, a slight delay of waveform 214 relative to waveform 212 results in a time overlap or coincidence of the pulses of waveform 214 with pulses of waveform 210 of FIG. 2a near times T2 and T10. Those pulses of waveform 214 of FIG. 2c, and those pulses of waveforms of FIGS. 2d–2j which partially or completely overlap in time with reference clock pulses 210 of FIG. 2a are shaded for easy identification, thereby indicating the times at which AND gate 54 produces a coincidence pulse. AND gate 54 produces coincidence pulses at both time T2 and at time T10, which are applied to the R input terminal of FF56 to reset FF56 and stop the counting by counter 58, and also to latch the count from counter 58 in latch 62. The first of these reset pulses, namely the one occurring at time T2, stops counter 58 and latches its count into latch 62, and the second and other possible later reset pulses have no further effect. Thus, a slight phase difference between the original and replica chip clock pulses such as the slight phase difference between pulse waveforms 214 of FIG. 2c and 212 of FIG. 2b results in a very short period of counting, such as the time between T0 and T2 in FIG. 2, and therefore results in a very small count in counter 58.

A slightly larger phase difference between the original chip clock pulses produced by VCO/PLL 10 and the replica chip clock pulses produced by VCO 34 establishes a phase difference such as that illustrated by waveform 216 of FIG. 2d, and produces no coincidence between pulses of waveform 216 and those of waveform 210 of FIG. 2a near time T0, and instead produces a single coincidence centered on a time T12. This single coincidence produces a pulse from AND gate 54 at a time near time T12 for stopping the count of counter 58 and latching of the count therein. As in the case of FIG. 2c, that pulse of waveform 216 of FIG. 2d which is coincident (at time T12) with a pulse of waveform 210 of FIG. 2a is shaded.

Waveform 218 of FIG. 2e illustrates a yet further slight phase difference between the replica chip clock and the original chip clock signals (waveform 212 of FIG. 2b). Coincidences between pulses of pulse train 218 and pulses of reference pulse train 210 occur near times T14 and T18. Waveform 220 of FIG. 2f illustrates a further incremental delay of the replica chip clock signal relative to the original chip clock signal (212 of FIG. 2b). Coincidence occurs between a pulse of waveform 220 of FIG. 2f and a pulse of reference clock pulse waveform 210 of FIG. 2a only at a single time, near T18. FIGS. 2g and 2h illustrate by pulse waveforms 222 and 224, respectively, a further dual and single coincidence produced at times near T20 and T28 by further incremental delays of the replica chip clock signal. The pattern of alternating multiple and single coincidences between the replica chip clock signal and the reference pulses 210 of FIG. 2a continues until the condition illustrated by waveform 226 of FIG. 2i is reached in which coincidence between the last pulse of replica clock pulse train 226 and a pulse 210 of FIG. 2a occurs near a time T70. When coincidence occurs in the manner illustrated in FIG. 2i, counter 58 counts reference clock signals for almost the entire period of the pseudorandom signal, which as illustrated in FIG. 2 is only 8 chip clock pulses but which in the example of FIG. 1 is approximately 900 chip clock pulses. A further incremental delay returns the replica chip clock pulse into phase coincidence with the original chip clock pulse produced by VCO/PLL 10 as illustrated by waveform 228 of FIG. 2j, and therefore brings it into phase coincidence with the reference pulses 210 of FIG. 2a at times T0. Consequently, coincidence begins at time T0, and counter 58 therefore counts no reference clock pulses before being disabled. It should be noted that the pattern of alternating multiple and single coincidences is selected by establishing a minimum width for the pulses of the reference clock pulse trains and the replica clock pulse train, so as to prevent the possibility of a lack of any coincidence, which would prevent counter 58 from turning off and latch 62 from latching the count. A narrower pulse width would create a sequence of single coincidences as a function of phase, with the possibility of lack of coincidences at certain delays of delay path 24.

On the timing diagrams of FIG. 2, it can be seen that the vernier counting arrangement 50 of FIG. 1 counts reference clock signals from reference clock generator 5 which are at a lower frequency than the original chip clock signals produced by VCO/PLL 10. The counting occurs during each PRS cycle for a proportion of the PRS cycle which is the same as the proportion of the excess delay of delay path 24 over the duration of an integer number of chip clocks cycles.

In the 5.0 MHz reference frequency, 8.64 MHz chip frequency, 900 chip example, the counting occurs during recurrent 25 $\mu$S intervals, corresponding to a 40 KHz rate, which is the highest common sub-harmonic frequency of both 5.0 MHz and 8.64 MHz. In this case, the interval between successive times T0 in FIG. 2 would correspond to 25 $\mu$S, and as many as 125 5.0 MHz reference pulses could be counted. In effect, this subdivides the interval between two successive 8.64 MHz chip clock pulses into 125 parts, and increases the time resolution of the delay of delay path 24. To be more specific, if latch 42 were to latch a digital word representing 15, and latch 62 were to latch a digital word representing a count of 78, this would mean that the delay of delay 24 equals the duration of 15 8.64 MHz chip clock cycles (1.7361 $\mu$S), plus 78/125 of the duration of one 8.64 MHz chip clock cycle (0.624×0.11574 $\mu$=0.0722 $\mu$S) for a total delay of 1.8083 $\mu$S. The time resolution has been increased by a factor of 125 in this example, which is the equivalent of a chip clock frequency of 125×8.64 MHz=1080 MHz. At the current state of the art, counters and logic gates operating at this frequency are either unavailable or are complex and very expensive. However, the described arrangement requires only an 8.64 MHz counting rate, which is well within the capabilities of inexpensive counters.

As described, the arrangement of FIG. 1 is well adapted for use with delays of delay path 24 which are less than the duration of one pseudorandom signal cycle (approximately 104 microseconds in the described 900-chip embodiment). For longer delays, other means must be used to determine the number of integer pseudorandom cycle intervals in the delay, or the count of modulo counter 16 and 36 may be increased to extend the PRS cycle duration to encompass the expected delay of the delay path.

Figures 3A, 3B, 3C, 3D:
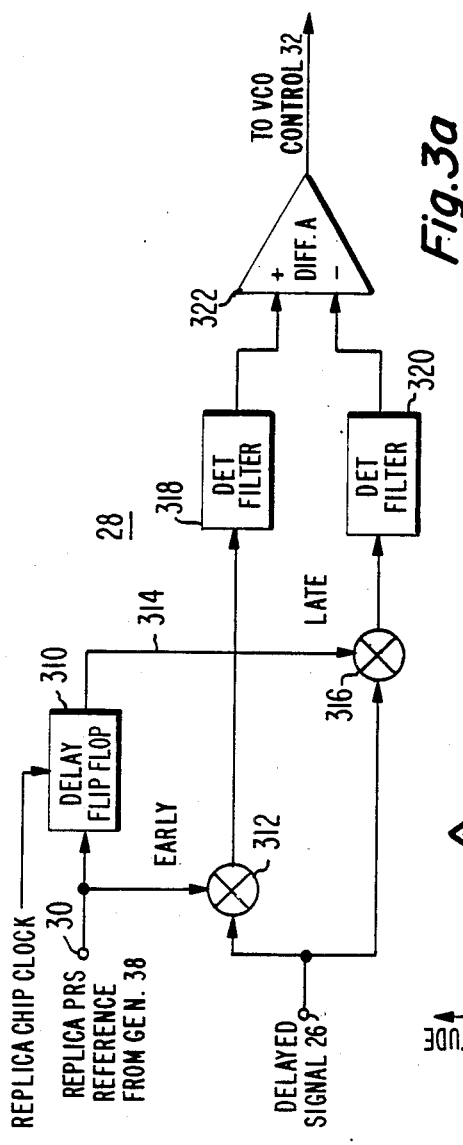
FIG. 3a is a block diagram of the correlation receiver of the embodiment of FIG. 1, and FIGS. 3b, 3c and 3d represent the output signals of various portions of the correlation receiver under various operating conditions.

FIG. 3a is a block diagram of correlation receiver 28 of FIG. 1. Elements of FIG. 3a corresponding to those of FIG. 1 are designated by the same reference numeral. In FIG. 3a, the replica PRS signal from PRS generator 38 is applied by way of terminal 30 to a delay flip flop (FF) 310 and to an input terminal of a first correlator 312. The replica chip clock is also applied to delay FF 310 for clocking thereof to produce on a conductor 314 a late version of the replica PRS signal. The delay of the delayed replica PRS signal on conductor 314 relative to the undelayed (EARLY) replica PRS signal at terminal 30 is exactly one replica chip clock period (which is exactly equal to one original chip clock period when DLL 40 of FIG. 1 is locked). The LATE replica PRS signal on conductor 314 is applied to an input terminal of a second correlator 316. Correlators 312 and 316 receive at second input terminals the delayed signal from output terminal 26 of delay path 24 (FIG. 1). When processing RF signals, correlators 312 and 316 are implemented as double-balanced mixers, and when processing baseband signals they are implemented as exclusive —OR logic gates. Correlator 312 produces an output signal, the average amplitude of which depends upon the relative delay or phase between the EARLY replica PRS signal at terminal 30 and the delayed PRS signal at terminal 26, as illustrated by waveform 350 of FIG. 3b. As illustrated, waveform 350 is a maximum at time T0, representing the in-phase condition. Waveform 350 has zero magnitude at times T−1 and T+1, representing a relative time displacement of one chip clock cycle between the EARLY replica PRS signal at terminal 30 and the delayed PRS signal at terminal 26. The output signal of correlator 312 is averaged (and, if necessary, detected) by a detector-filter illustrated as a block 318. Similarly, correlator 316 produces an output signal, the average amplitude of which depends upon the relative delay or phase shift between the LATE replica PRS signal on conductor 314 and the delayed PRS signal at terminal 26, as illustrated by waveform 352 of FIG. 3c. As illustrated, waveform 352 is a maximum (has maximum average amplitude) at time T+1, representing an in-phase condition. Waveform 352 has zero magnitude at times T0 and T+2, representing a relative time displacement of one chip clock cycle between the LATE replica PRS signal on conductor 314 and the delayed PRS signal at terminal 26. The maximum output of waveform 350 of FIG. 3b occurs when waveform 352 is at a minimum, and vice versa. The output signal of correlator 316 is averaged (and, if necessary, detected) by a detector-filter illustrated as a block 320. As the delayed PRS signal at terminal 26 ranges over a delay interval of one chip clock cycle, as from T0 to T+1, the outputs of correlator 312 and detector-filter 318 go from maximum to zero, while for this same change, the outputs of correlator 316 and detector-filter 320 goes from zero to maximum.

The output signals from detector-filters 318 and 320 are applied to the noninverting and inverting input terminals, respectively, of a differential amplifier or subtractor 322, which takes the difference therebetween, to produce as an output the control signal on conductor 32. The control signal on conductor 32 has a characteristic such as that illustrated as 354 of FIG. 3d, which is waveform 350 of FIG. 3b minus waveform 352 of FIG. 3c. The characteristic of waveform 354 of FIG. 3d in the interval between T0 and T+1 has the shape of a discriminator curve and, when controlling DLL 40 (FIG. 1) controls the exact phase of VCO 34 (FIG. 1). Under steady-state conditions the center of waveform 354 at time $T+\frac{1}{2}$ is the quiescent point. This introduces an incidental delay of one-half clock pulse. This incidental delay effectively advances the phase of the replica PRS signal produced by generator 38 by one-half clock cycle, which may be corrected by inserting one-half chip clock cycle delays 337 and 344 into conductive paths 37 and 44, respectively, of FIG. 1. The half-cycle delay may be corrected in many other fashions, or accounted for in the final delay or phase calculation (not illustrated).

Figure 4:
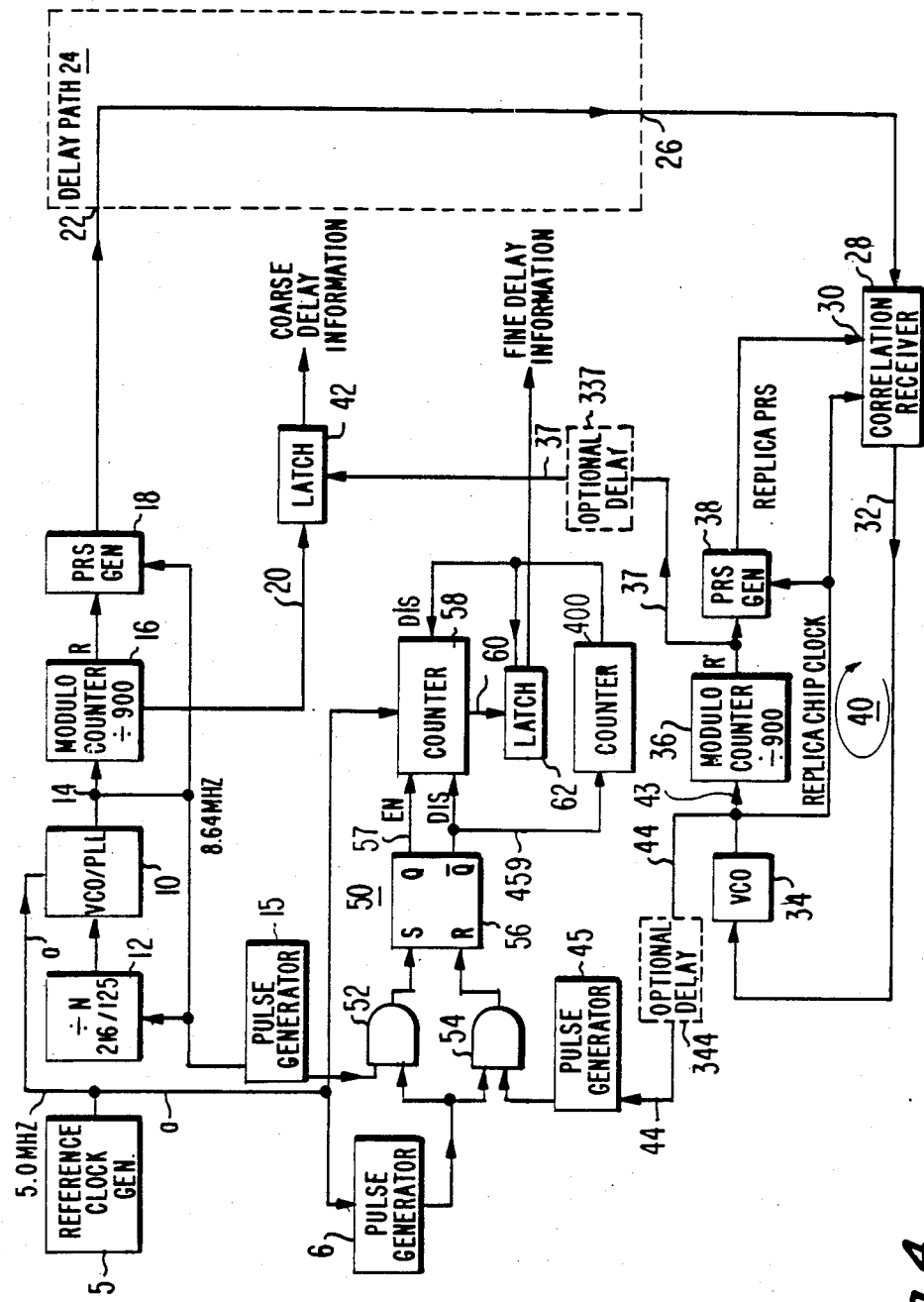
FIG. 4 is a block diagram illustrating another embodiment of the invention.
Figure 5:
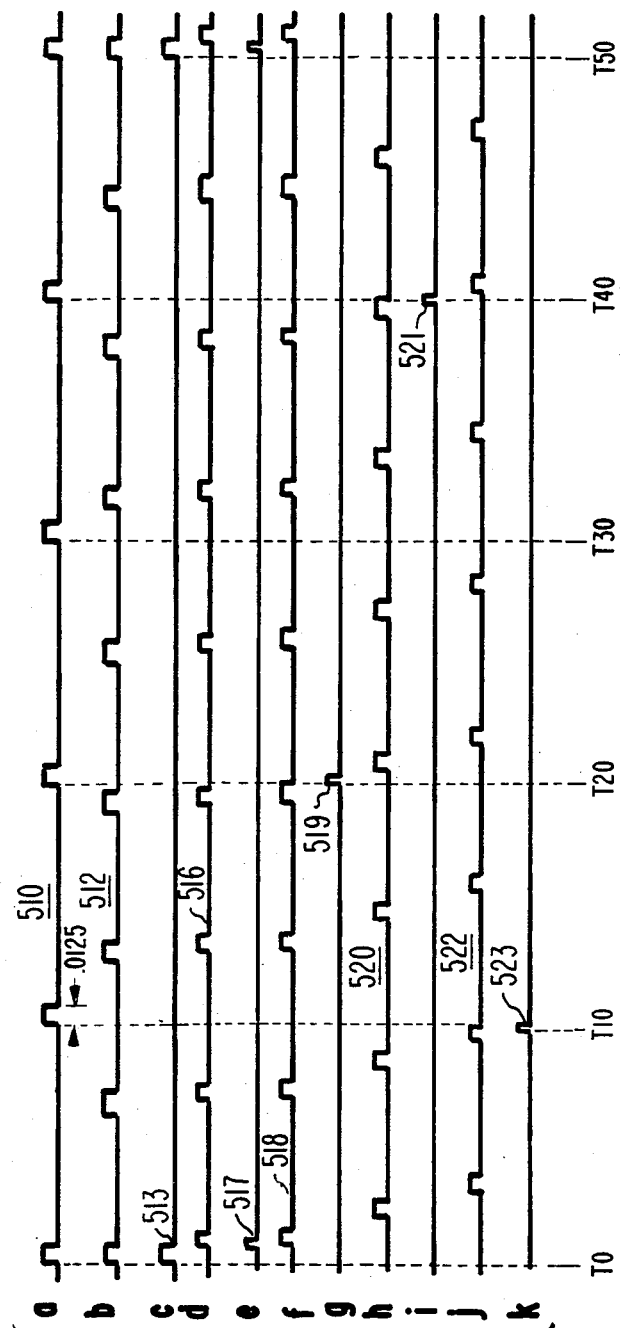
FIGS. 5a–5k are timing diagrams, referred to jointly as FIG. 5, illustrating reference pulses and the nonprogressive coincidence of replica chip clock pulses and reference pulses.

FIG. 4 is a block diagram illustrating another embodiment of the invention. FIG. 4 is very similar to FIG. 1. Elements of FIG. 4 corresponding to those of FIG. 1 are designated by the same reference numeral. FIG. 4 differs from FIG. 1 in that the $\overline{Q}$ output of FF56 of vernier counting arrangement 50 is not connected directly to the DISABLE input terminal of counter 58 and to latch 62, but rather is connected thereto by way of a further counter 400. Counter 400 is a modulo counter which counts for a predetermined number of cycles of the signal from the $\overline{Q}$ output of FF56. The predetermined number by which it counts may be an integer such as 10. Counter 400 allows counter 58, once it is enabled by an ENABLE signal from the Q output of FF56, to count for multiple PRS cycles, such as for 10 PRS cycles, thereby increasing the sensitivity of the vernier counting arrangement by a factor such as 10.

FIGS. 5a-5k are timing diagrams similar to FIGS. 2a-2j in which the progression or coincidence of the delayed replica chip clock pulses with the reference clock pulses is not a linear progression. Such a condition occurs with certain ratios of chip clock frequency to reference clock frequency, such as the ratio 8/5 illustrated by reference clock pulses 510 of FIG. 5a and the original chip clock pulses 512 of FIG. 5b. When the replica chip clock pulses (516, 518, 520, 522 of FIGS. 5d, 5f, 5h, 5j respectively) are in-phase with the original chip clock pulses (512 of FIG. 5b) produced by VCO/PLL 10, so that the replica chip clock pulses appear to be identical to pulses 512 of FIG. 5b, coincidence of reference pulses 510 and replica chip pulses occurs near a time T0 to produce coincidence pulses from AND gate 54 (FIGS. 1 or 4), as illustrated by coincidence pulses 513 of FIG. 5c. A very slight delay of the replica chip clock pulses such as that illustrated by pulses 516 in FIG. 5d produces shortened coincidence pulses such as pulses 517 of FIG. 5e, without appreciable timing change. A further slight delay of the replica clock pulses produces a train of pulses such as pulse train 518 of FIG. 5f. The coincidence of pulses of pulse train 518 of FIG. 5f with reference clock pulses 510 of FIG. 5a produces pulses from AND gate 54 similar to pulses 519 occurring near time T20. A further delay of the replica chip clock pulses by delay 24 produces a pulse train such as pulse train 520 of FIG. 5h, which coincides with a pulse of pulse train 510 of FIG. 5a near a time T40. A still further delay of the replica chip clock pulse train is illustrated by pulse train 522 of FIG. 5j, the pulses of which come into coincidence with the reference clock pulses 510 near a time T10. Thus, the repeating cycle of coincidences for the ratio 8/5 follows the pattern 5, 2, 4, 1, 3; 5, 2, 4, 1, 3; 5 ... Thus, the count of reference clock signals stored in counter 58 and latched into latch 62 uniquely identifies the fractional portion of the relative phase shift between the original PRS signal produced by generator 18 and the replica PRS signal produced by generator 38, but is not proportional thereto. Naturally, ratios other than 8/5 will produce other nonproportional sequences.

Figure 6:
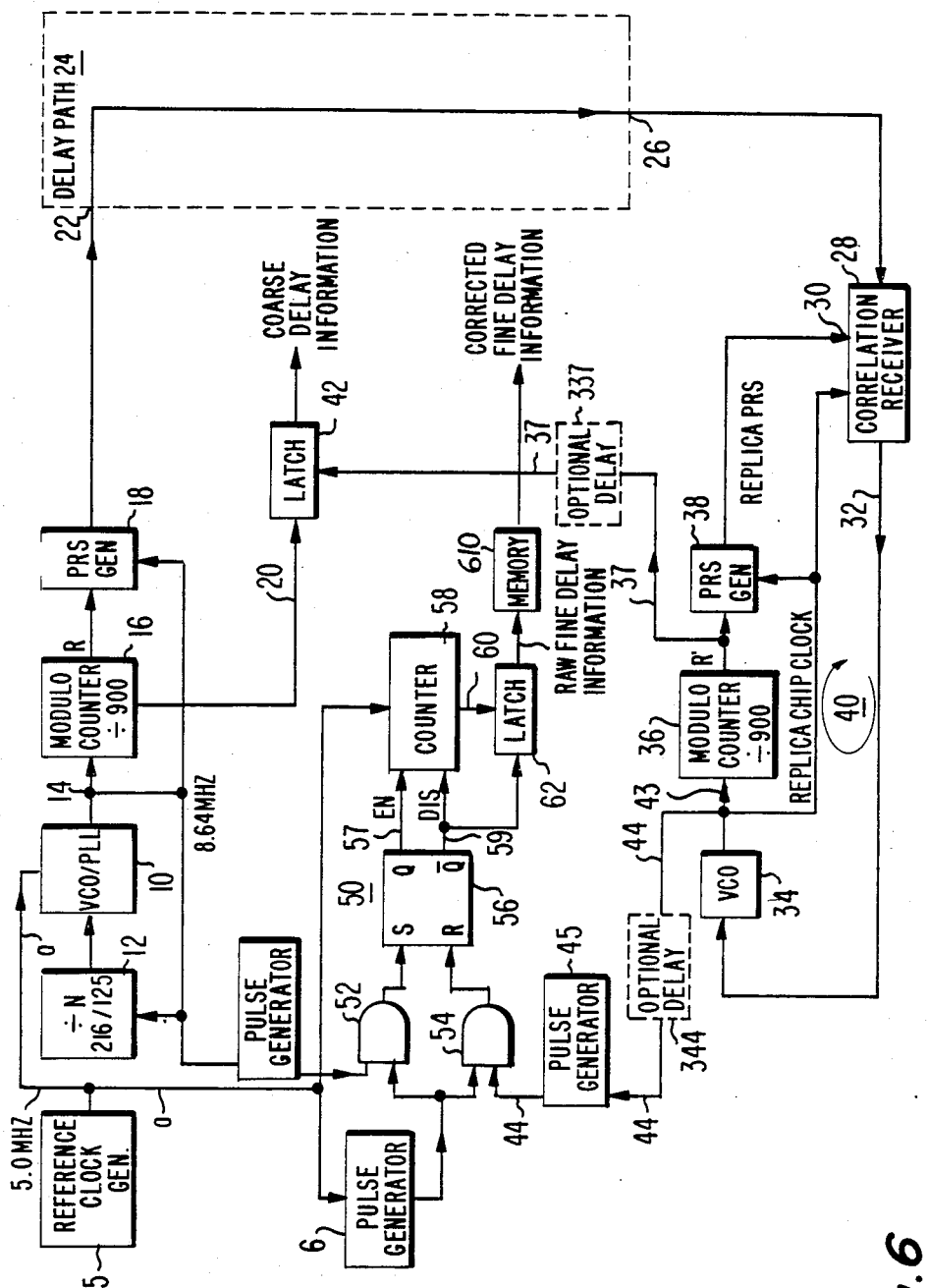
FIG. 6 is a block diagram illustrating the use of a programmed memory for interpreting the nonprogressive sequence of pulses illustrated in FIG. 5.

FIG. 6 is a block diagram of another embodiment of the invention similar to that of FIG. 1. In FIG. 6, elements corresponding to those of FIG. 1 are designated by the same reference numeral. FIG. 6 differs from FIG. 1 in that it includes a memory 610 coupled to receive the fine detail information from latch 62 in the form of a nonproportional count such as that described in conjunction with FIG. 5. Memory 610 is addressed by the fine delay information from latch 62 and is preprogrammed at the addressed memory locations to convert the nonproportionate count information into proportional information. For example, in order to convert the count latched by count 62 for the 8/5 ratio illustrated in FIG. 5, memory 610 would be programmed at address locations 01, 02, 03, 04, and 05 (corresponding to possible counts latched into latch 62) with the digital words 03, 01, 04, 02 and 05, representing fractional delays of 3/5, 1/5, 4/5, 2/5 and 5/5, respectively, of a chip clock cycle duration. This means that the vernier counter is indicating that the delay of delay path 24 exceeds an integer multiple of the duration of the chip clock cycle (established by the coarse count stored in latch 42) by one of 1/5, 2/5, 3/5, 4/5, or 5/5 of a chip clock cycle. The 5/5, of course, represents a delay of delay path 24 equal to an integer number of chip clock cycles, so that there is no fractional portion of a PRS cycle in the delay. Memory 610 supplies corrected fine delay information to utilization apparatus (not illustrated) in conjunction with the coarse delay information from latch 42.

Other embodiments of the invention will be apparent to those skilled in the art. For example, ratios of reference clock frequency to chip clock frequency other than 216/125 may be used.

What is claimed is:

1. Apparatus for measuring the phase difference between two signals, comprising:
   a reference clock signal generator having a reference frequency;
   a first chip clock signal generator for generating a first chip clock signal which is slaved to said reference clock signal at a first chip frequency which is a multiple of said reference frequency, said multiple being a ratio of integers;
   first counting means coupled to said first chip clock signal generator for dividing said first chip frequency to produce a first count signal indicative of the count and for being reset to zero and for producing a first reset signal at a predetermined integer count;

first pseudorandom waveform generating means coupled to said first chip clock signal generator and to said first counting means, and adapted to be coupled to phase shifting means, for generating and applying to said phase shifting means a particular pseudorandom waveform at said first chip frequency, and for being reset to an initial state by said first reset signal;

latching means including a latch control input terminal, said latching means being coupled to said first counting means for receiving said first count signal and for latching said first count signal under control of a second reset signal applied to said latch control input terminal;

correlation receiving means adapted to be coupled to said phase shifting means for receiving phase shifted pseudorandom waveform therefrom at said chip frequency, for generating a delay loop control signal which is related to the phase offset between a replica of said pseudorandom waveform and said phase shifted pseudorandom waveform;

a slaved chip clock signal generator coupled to said correlation receiving means for receiving said delay loop control signal for generating a slaved chip clock signal at a controllable frequency;

second counting means coupled to said slaved chip clock signal generator and to said latch control input terminal of said latching means for receiving said slaved chip clock for dividing said frequency by said predetermined integer, for being reset to zero at said predetermined integer count, and for producing said second reset signal at each said predetermined integer count, said second reset signal being coupled to said latch control input terminal of said latching means for latching said latching means;

second pseudorandom waveform generating means coupled to said slaved chip clock signal generator, to said second counting means, and to said correlation receiving means for generating and applying said particular pseudorandom waveform to said correlation receiving means at said controllable frequency of said slaved chip clock signal, and for being reset to said initial state by said second reset signal, said correlation receiving means, slaved chip clock signal generator, second counting means and second pseudorandom waveform generator together forming a delay locked loop by which said controllable frequency is made equal to said first chip frequency and also by which said second reset signal occurs at a time relative to said first reset signal which is controlled by the time delay of said phase shifting means, whereby said latching of said latching means by said second reset signal is delayed relative to said reset of said first counting means and latches a gross count in said latching means equal to said time delay within the resolution accuracy provided by said first chip clock frequency;

first and second AND gate means, each including first and second input terminals;

first coupling means coupled to said reference clock signal generator, to said first and slaved chip clock signal generators for applying reference pulses controlled by said reference clock signal generator to said first input terminals of said first and second AND gate means, for applying first chip pulses controlled by said first chip clock signal generator to said second input terminal of said first AND gate means, and for applying slaved pulses controlled by said slaved chip clock signal generator to said second input terminal of said second AND gate means, for producing a START signal from said first AND gate means at each coincidence of one of said first chip pulses and one of said reference pulses, which coincidence of said first chip pulses and said reference pulses recur at a lower frequency than either of said reference frequency and said first chip frequency, and for producing a STOP signal from said second AND gate means at each coincidence of one of said slaved pulses and one of said reference pulses, which coincidence of said slaved pulses and said reference pulses recur at said lower frequency, whereby a said STOP signal occurs at a time after a said START signal equal to the product of a time between successive START signals multiplied by a quotient, said quotient being the ratio of first and second time differences, said first time difference being equal to the time between the occurrence of said second reset signal and that one of said first chip clock signals immediately preceding said second reset signals, and said second time difference being the time between two successive first chip clock signals, whereupon the exact time of occurrence of said second reset signal between two successive first chip clock signals is proportional to the delay of said STOP signals after said START signal relative to the reciprocal of said lower frequency;

third counting means coupled to said reference clock signal generator and responsive to an ENABLE signal for counting said reference clock signals for generating a fine count;

toggle means coupled to said first and second AND gate means and to said third counting means for assuming a first state in response to the first of one or more successive START signals, and for assuming a second state upon the occurrence of the first STOP signal occurring after a previous START signal for, when in said first state, generating and applying said ENABLE signal to said third counting means for initiating counting of said reference clock signals in response to said first state, and in said second state for ceasing production of said ENABLE signal, thereby causing cessation of counting of said reference clock pulses by said third counting means, whereby said fine count in said third counting means at the time of occurrence of said first STOP signal occurring after a previous START signal provides additional information relative to said phase to a greater resolution than that provided by said first chip clock frequency.

2. Apparatus according to claim 1, further comprising:

second latching means coupled to said third counting means and to said toggle means and responsive to the initiation of said second state for latching said fine count.

3. Apparatus according to claim 1, wherein:

said third counting means begins counting in response to said ENABLE signal, and continues to count until receipt of a DISABLE signal; and further comprising:

fourth counting means coupled to said toggle means and to said third counting means for counting a predetermined number of said ENABLE signals before generating and applying said DISABLE signal to said third counting means.

4. Apparatus according to claim 2, wherein each word of said fine count generated by said third counting means uniquely represents in a nonmonotonic progression a particular value of said quotient, and further comprising:

memory means coupled to said second latching means, said memory means including memory locations addressed by each word of said fine count, each said memory location being preprogrammed with a word which represents a particular value of said quotient selected for conversion of said nonmonotonic progression to a monotonic progression.

5. A method for measuring the round-trip delay of a signal path, comprising the steps of:

generating a reference clock signal having a reference frequency;

slaving an original chip clock signal to said reference clock signal at a chip clock frequency which is a multiple of said reference frequency, where said multiple is the ratio of integers;

modulo counting said original chip clock signal to produce a count signal and to produce first reset signals at a predetermined count;

generating chips of a particular pseudorandom signal at said chip clock frequency, said particular pseudorandom signal recurring in response to said first reset signals to form a recurrent particular pseudorandom signal;

applying said recurrent particular pseudorandom signal to a first end of said signal path;

receiving said recurrent particular pseudorandom signal from said signal path to form a received signal, which is said recurrent particular pseudorandom signal delayed by the delay of said signal path;

generating a replica chip clock signal at a frequency near said chip clock frequency;

modulo counting said replica chip clock signal to produce second reset signals at said predetermined count;

generating chips of a second pseudorandom signal having the same pattern a said particular pseudorandom signal in response to said replica chip clock signal, said pseudorandom signal recurring in response to said second reset signal;

comparing the phase of said received signal with said second pseudorandom signal to form a control signal;

controlling the frequency of said replica chip clock signal in response to said control signal for forcing said frequency near said chip clock frequency to equal said chip clock frequency, whereby said second reset signal is delayed from said first reset signal by said delay of said signal path;

storing the value of said count signal in response to said second reset signal to provide a coarse indication of said delay of said signal path;

generating a START signal at each coincidence of said original chip clock signal and said reference clock signal;

beginning counting of said reference clock signal in a counter in response to one of said START signals;

generating a STOP signal at each coincidence of said replica chip clock signal and said reference clock signal;

ending counting of said reference clock signal in response to one of said STOP signals occurring after one of said START signals to thereby produce a fine indication of the increment of said delay of said path over the value of said delay of said signal path provided by said coarse indication; and utilizing the information of said coarse and fine indications to provide a final indication of said delay of said signal path.

6. A method according to claim 5, wherein said step of ending counting of said reference clock signal further comprises the steps of:

blocking application of said STOP signals to said counter;

counting a predetermined number of said STOP signals to produce an unblocking signal; and ceasing said blocking in response to said unblocking signals.

* * * * *